United States Patent [19]

Powell et al.

[11] Patent Number: 5,022,853
[45] Date of Patent: Jun. 11, 1991

[54] SEMICONDUCTOR PROCESSING FURNACE TUBE AND ALIGNMENT JIG

[75] Inventors: Eric Powell; Navjot Chhabra, both of Boise, Id.

[73] Assignee: Micron Technology, Inc., Boise, Id.

[21] Appl. No.: 513,555

[22] Filed: Apr. 24, 1990

[51] Int. Cl.5 .............................. F27B 5/16; F27B 9/04
[52] U.S. Cl. .................................... 432/200; 432/152
[58] Field of Search ............... 432/200, 152, 239, 241, 432/253; 118/715, 725

[56] References Cited

U.S. PATENT DOCUMENTS 4,680,008 7/1987 Rioux ................................... 432/72
4,767,251 8/1988 Whang ............................. 432/239 X Primary Examiner—Henry A. Bennett
Assistant Examiner—Christopher B. Kilner
Attorney, Agent, or Firm—Wells, St. John & Roberts

[57] ABSTRACT

Disclosed is a quartz tube for a furnace for processing semiconductor wafers. The furnace comprises:
an elongated hollow body having opposed first and second ends and a longitudinal axis;
an injector opening being formed in the first end, the injector opening including sidewalls which are spaced to slidably receive an elongated gas injector assembly through the opening; and
an alignment jig received within the hollow body inwardly adjacent the first end and injector opening, the alignment jig including support means for engaging and aligning a gas injector with the injector opening to support a gas injector to emit gas substantially along the longitudinal tube body axis.

2 Claims, 1 Drawing Sheet

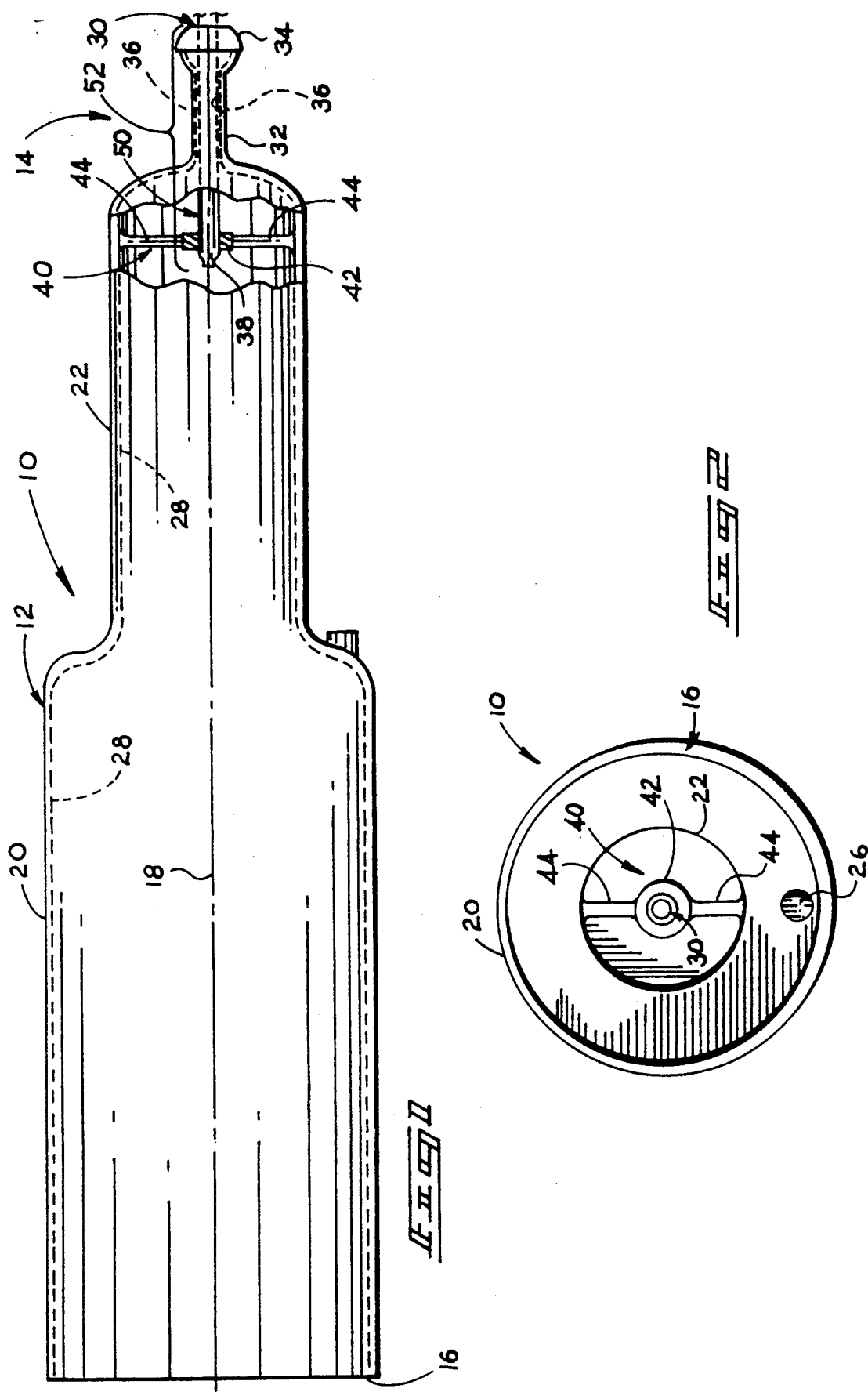

SEMICONDUCTOR PROCESSING FURNACE TUBE AND ALIGNMENT JIG

TECHNICAL FIELD

This invention relates generally to improvements in quartz tubes for furnaces for processing semiconductor wafers.

BACKGROUND OF THE INVENTION

In semiconductor processing, wafers are treated in elongated tube-like furnaces. The furnaces are wrapped with electric coils to provide the heat energy to maintain the furnace at a desired temperature. Replaceable hollow quartz tubes or sleeves are received immediately adjacent the inner walls of the furnace, and can be slid into and out of the furnace from one of the furnace ends. The wafers to be treated are vertically oriented on an elongated paddle which is slid into and out of the end of the furnace and quartz tube received therein.

One end of the quartz tube includes an opening through which a gas injector assembly is positioned. The injector assembly would be used to inject a gas mixture into the furnace for treating wafers which are within the furnace. The nozzle end of the injector is at the end of a long tube. One of the problems associated with use of such injectors is the positioning of the injector tube relative to the quartz tube opening.

For example, it is desirable that the injector be perfectly aligned with the longitudinal axis of the quartz tube and furnace in an effort to inject the gases uniformly along the cross section of the quartz tube. However, the injector can be angled relative to the quartz tube opening. This can cause misalignment of the injector assembly relative to the tube. The result is fluctuation in the processing due to the heat and gas being dissipated at an angle. This can have the effect of reducing the yield of the finished dies or adversely impact an entire wafer.

BRIEF DESCRIPTION OF THE DRAWINGS

The preferred embodiment of the invention is illustrated in the accompanying drawings, in which:

FIG. 1 is a fragmentary side elevational view of a quartz tube for a furnace for processing semiconductor wafers in accordance with the invention.

FIG. 2 is a left end view of the FIG. 1 tube.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

Referring to FIGS. 1 and 2, a quartz tube for a furnace for processing semiconductor wafers in accordance with the invention is indicated generally with reference numeral 10. Quartz tube 10 is comprised of an elongated hollow body 12 having first and second ends 14, 16 respectively, and a longitudinal axis 18. In the illustrated embodiment, hollow body 12 is comprised of two longitudinal sections 20, 22. Section 20 is larger in diameter than section 22, and extends from second end 16. Section 22 extends generally from first end 14 and integrally connects with section 20. Longitudinal axis 18 is concentric about each of first and second sections 20, 22. Interior or inner tube body walls are indicated by reference numeral 28.

The illustrated embodiment has first section dimensions of an internal diameter of 211 mm, with the first section tubing thickness being 10 mm to provide an external diameter of 221 mm. Second section 22 has an internal diameter of 135 mm and a wall thickness of 6 mm to provide an external diameter of 141 mm. A Thermacouple well 26 is provided at the lower part of first section 20, and does not constitute any part of what is claimed as the invention.

An injector opening 30 is formed in first end 14. Injector opening 30 is defined by an elongated extension 32 which extends from section 22 to an enlarged opened end ball like object 34 which is formed during the fabrication of the quartz tube. Extension 32 defines interior opening side walls 36 which are spaced sufficiently from one another to define an opening diameter which slidably receives an elongated gas injector assembly 38 through opening 30. The tube of the invention is of a type adapted for slidably and removably receiving a particular elongated gas injector assembly 38. The particular gas injector assembly 38 comprises an elongated cylinder 50 which defines an injector nozzle end indicated by numeral 52. Injector nozzle end 52 is configured to be received entirely within tube assembly 20, and particularly through elongated tube extension 32. The portion of elongated cylinder 50 comprising injector end 52 has smooth coextensive outer cylindrical walls of a defined outer diameter, with the outer cylindrical walls of the injector end 52 being void of any external radial projections. As is apparent from FIG. 1, injector cylinder 50 and injector opening 30 are sized to enable both free slidable insertion and removal of the entire injector nozzle end 52 therethrough.

A quartz alignment jig 40 is received within hollowed body 12 and within section 22 inwardly adjacent first end 14, injector opening 30 and extension 32. Alignment jig 40 includes support means for engaging and aligning gas injector assembly 38 with injector opening 30 to support the gas injector to emit gas substantially along longitudinal tube body axis 18. More particularly, the support mean comprises a hollow quartz ring-like member 42 having an internal opening or diameter sized just large enough to receive and contact gas injector assembly 38 which extends into tube 12 through quartz tube opening 30. Ring-like member 42 is supported within tube section 22 to be immobily aligned with injector opening 30 along longitudinal tube axis 18. Ring-like member 42 is so supported by a pair of radially opposed support extensions 44 which extend outwardly from ring-like member 42 to the quartz tube body inner walls 28. Extensions 44 are dimensioned to centrally position ring-like member 42 precisely on longitudinal tube axis 18. In this manner, the longitudinal tube axis and center ring axis are coincident.

Ring-like member 42 and support extensions 44 have respective thicknesses, with the thickness of ring-like member 42 being greater than the thickness of support extensions 44. In the illustrated and described embodiment, the thickness of the ring-like member 42 is 9 mm, while the thickness of support extensions 44 is 7 mm. Support extensions 44 are in the form of cylindrical quartz rods.

Support extensions 44 would be heat welded to the external surface of ring-like member 42, and preferably heat welded internally within tube 12 to inner quartz tube walls 28. In this manner alignment jig 40 is welded to tube body inner walls 28.

Alignment jig 40 functions by engaging, supporting and aligning gas injector assembly relative to hollow tube body 12 and its longitudinal axis 18. Supporting the injector as indicated, holds it in a position relative to the longitudinal axis such that gas is emitted substantially along the longitudinal body axis.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A tube for a furnace for processing semiconductor wafers, the tube being of a type adapted for slidably and removably receiving a particular elongated gas injector assembly, the particular gas injector assembly comprising an elongated cylinder having an injector nozzle end which is configured to be received entirely within the tube, the elongated cylinder of the injector end having smooth coextensive outer cylindrical walls of a defined outer diameter, the outer cylindrical walls of the injector nozzle end being void of external radial projections, the tube comprising:

an elongated hollow body having opposed first and second ends, inner and outer longitudinal walls, and a longitudinal axis;

an injector opening being formed in the first end, the injector opening including sidewalls which are spaced to slidably receive the particular elongated gas injector assembly through the opening, the injector opening being sized to enable both slidable insertion and removal of the entire injector nozzle end therethrough; and an alignment jig received within the hollow body inwardly adjacent the first end and injector opening, the alignment jig comprising a ring-like member having an internal open diameter and central axis, the ring-like member open diameter being slightly larger than the outer diameter of the gas injector cylindrical walls to slidably and removably receive the outer cylindrical walls of the gas injector elongated cylinder to contact and support the elongated cylinder, the ring-like member being immobily welded to the internal longitudinal tube walls to position the ring-like member central axis coincident with the longitudinal tube axis for emitting gas from the particular gas injector received by the ring-like member substantially along the longitudinal tube body axis.

2. The tube of claim 1 further comprising at least two support extensions extending radially from the ring-like member, the support extensions being welded to the tube internal longitudinal walls.

* * * * *